United States Patent [19]
Iwatani

[11] 4,314,270
[45] Feb. 2, 1982

[54] HYBRID THICK FILM INTEGRATED CIRCUIT HEAT DISSIPATING AND GROUNDING ASSEMBLY

[75] Inventor: Shiro Iwatani, Himeji, Japan

[73] Assignee: Mitsubishi Denki Kabushiki Kaisha, Tokyo, Japan

[21] Appl. No.: 196,093

[22] Filed: Oct. 10, 1980

Related U.S. Application Data

[63] Continuation of Ser. No. 964,439, Nov. 28, 1978, abandoned.

Foreign Application Priority Data

Dec. 2, 1977 [JP] Japan .......................... 52-162597

[51] Int. Cl.³ ............... H01L 23/16; H01L 23/02; H01L 23/12
[52] U.S. Cl. ................................. 357/75; 357/74; 357/80; 357/81
[58] Field of Search ................... 357/74, 75, 80, 81

[56] References Cited

U.S. PATENT DOCUMENTS

| | | | |
|---|---|---|---|
| 3,439,255 | 4/1969 | Carnes et al. | 357/80 |
| 3,447,057 | 5/1969 | Brown et al. | 357/75 |
| 3,539,884 | 11/1970 | Schaffner | 357/75 |
| 3,539,907 | 11/1970 | Linstedt | 357/75 |
| 3,763,403 | 10/1973 | Lootens | 357/80 |
| 4,032,964 | 6/1977 | Boeters | 357/75 |
| 4,128,801 | 12/1978 | Gansert et al. | 357/75 |
| 4,128,802 | 12/1978 | Gansert et al. | 357/75 |

Primary Examiner—Andrew J. James
Attorney, Agent, or Firm—Wenderoth, Lind & Ponack

[57] ABSTRACT

A common emitter NPN type power transistor is directly fixed to an internal surface of a metallic housing serving as both a heat sink and a grounding terminal and a ceramic substrate provided with a thick film integrated circuit for controlling the transistor and its positive terminal perpendicular to the some is also fixed to the internal surface of the metallic housing through a layer of bonding agent to be spaced from the transistor. Alternatively the transistor may be fixed to the metallic housing through a high electrically conducting member.

7 Claims, 3 Drawing Figures

U.S. Patent  Feb. 2, 1982  4,314,270 ly employed at present and
HYBRID THICK FILM INTEGRATED CIRCUIT HEAT DISSIPATING AND GROUNDING ASSEMBLY This application is a continuation of application Ser. No. 964,439 which was filed on Nov. 28, 1978 and is now abandoned.

BACKGROUND OF THE INVENTION

This invention relates to a structure of a hybrid thick film integrated circuit assembly formed of a common emitter type power transistor and a thick film integrated circuit for controlling the power transistor.

Hybrid thick film integrated circuit assemblies of the type referred to have been previously constructed so that the collector substrate type power transistor is disposed on that surface of a ceramic substrate having formed thereon a thick film integrated circuit for controlling the power transistor and that the ceramic substrate is attached through a layer of bonding agent to a bottom of a metallic housing which serves also as a heat sink for the transistor. In those constructions heat has been principally generated in the power transistor disposed on the ceramic substrate and then spread in the latter. Subsequently the heat has dissipated through a thermal path traced from the ceramic substrate through the layer of bonding agent and thence to the metallic housing serving also as the heat sink. This has caused an increase in thermal resistance presented by that thermal path resulting in the heat dissipation effect being insufficient. Further the thermal resistance has been dependent upon the amount and/or thickness of the bonding agent resulting in the low reliability of the completed assemblies.

Accordingly it is an object of the present invention to provide an improved hybrid thick film integrated circuit assembly including a power transistor element and a thick film integrated circuit element for controlling the power transistor element and exhibiting the good heat dissipation effect while being high in reliability.

It is another object of the present invention to provide an improved hybrid thick film integrated circuit assembly including a power transistor element, a thick film integrated circuit element for controlling the power transistor element and a metallic housing for both elements permitted to be used as a grounding terminal for the assembly.

SUMMARY OF THE INVENTION

The present invention provides a hybrid thick film integrated circuit assembly comprising a metallic housing, an emitter substrate type power transistor element, and a thick film integrated circuit element for controlling the power transistor element, the power transistor element and the thick film integrated circuit element being fixedly disposed in spaced relationship within the metallic housing, the power transistor element being put in electrically and thermally conducting relationship with the metallic housing, the metallic housing being used as a grounding terminal for the assembly.

Preferably the power transistor element may be directly fixed to the internal surface of the metallic housing through die bonding. Alternatively the power transistor element may be fixed to the internal surface of the metallic housing through a plate-shaped heat sink.

BRIEF DESCRIPTION OF THE DRAWING

The present invention will become more readily apparent from the following detailed description taken in conjunction with the accompanying drawing in which.

Throughout the Figures like reference numerals designate the identical or corresponding components.

DESCRIPTION OF THE PREFERRED EMBODIMENTS

Figure 1:
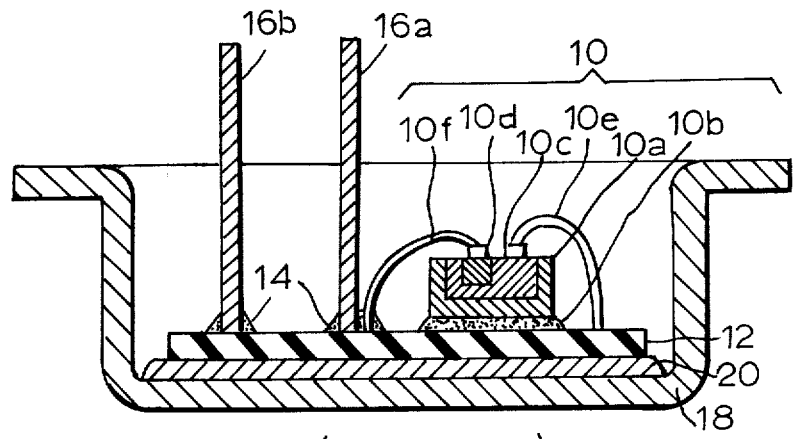
FIG. 1 is a longitudinal sectional view of a conventional structure of a hybrid thick film integrated circuit assembly with parts illustrated in elevation.

Referring now to FIG. 1 of the drawing, there is illustrated a hybrid thick film integrated circuit assembly of the conventional construction. The arrangement illustrated comprises a collector substrate type NPN power transistor 10 widely employed at present and including a semiconductor chip 10a, a collector electrode 10b, a base electrode 10c and an emitter electrode 10d disposed in ohmic contact with the semiconductor chip 10a as required, a base lead 10e connected at one end to the base electrode 10c and an emitter leaf 10f connected at one end to the emitter electrode 10d. The transistor 10 has the collector electrode 10b disposed on one surface, in this case, the upper surface as viewed in FIG. 1 of a ceramic substrate 12 which is provided on a predetermined portion of the upper surface thereof with a thick film integrated circuit (not shown) for controlling the transistor 10. The collector electrode 10b, and the other end of the base lead 10e are connected to corresponding points on the thick film integrated circuit while the other end of the emitter lead 10f is connected to a grounding point on the integrated circuit through a solder 14 with a grounding terminal 16a in the form of a rod extending perpendicularly to the upper surface of the ceramic substrate 12. Further a positive terminal 16b in the form of a rod is connected to a suitable point on the integrated circuit through a solder 14 to extend in parallel to the grounding terminal 16a.

Then the ceramic substrate 12 with both the power transistor 10 and the thick film integrated circuit is attached on the other or lower surface to a flat bottom of a flanged metallic housing 18 through a layer of bonding agent 20. The housing is formed, for example, of aluminum and serves also as a heat sink for the power transistor.

In the arrangement of FIG. 1, heat is principally generated in the power transistor 10 and spreads in the ceramic substrate 12 because the power transistor 10 generating the heat is disposed on the ceramic substrate 12. The heat dissipates through a thermal path traced from the ceramic substrate 12 through the bonding agent 20 and thence to the metallic housing 18 serving also as the heat sink. This has caused an increase in thermal resistance presented by that thermal path resulting in the heat dissipation effect being insufficient.

In order to improve the heat dissipation effect, it has been required to render a semiconductor chip 10a for the power transistor 10 and/or the metallic housing 18 large-sized which is attended with an increase in manufacturing cost.

Further the thermal resistance has been dependent upon the amount and/or thickness of the bonding agent 20 and apt to be more or less different from one to another of the assemblies resulting in the low reliability. In order to eliminate this objection, the semiconductor chip 10a for the power transistor 10 might be disposed on the flat bottom of the metallic housing 18. This measure has caused the metallic housing 18 to be put at the collector potential of the transistor 10 and therefore to a positive potential leading to the necessity of disposing the assembly in electrically insulating relationship on an associated equipment whenever it is attempted to do so. This measure has been difficult to be effected.

Figure 2:
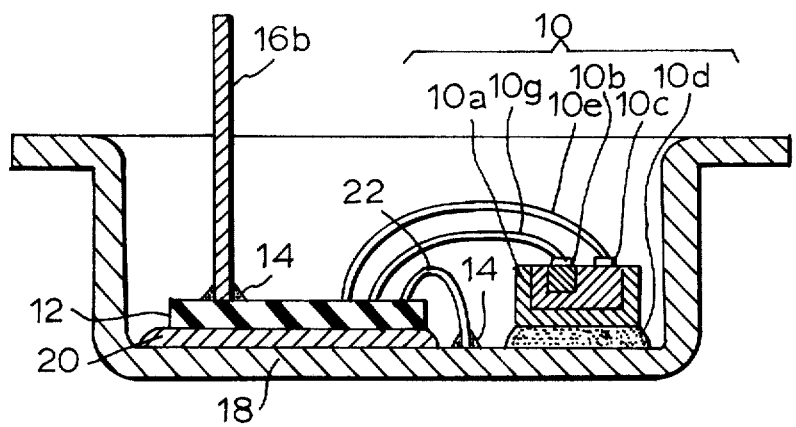
FIG. 2 is a longitudinal sectional view of one embodiment according to the hybrid thick film integrated circuit assembly of the present invention with parts illustrated in elevation.

Referring now to FIG. 2 there is illustrated one embodiment of the present invention. The arrangement illustrated is different from that shown in FIG. 1 principally in that in FIG. 2, the power transistor 10 is an emitter substrate type NPN transistor and includes the emitter electrode 10d attached directly to the flat bottom of the metallic housing 18 through die bonding. Therefore the transistor 10 is of an common emitter configuration and includes the collector and base electrodes 10b and 10c respectively disposed on the upper surface as viewed in FIG. 2 of the semiconductor chip 10a.

On the other hand, the ceramic substrate 12 has the thick film integrated circuit (not shown) disposed thereon and is attached to the same bottom of the metallic housing 18 as the power transistor 10 in the same manner as above described in conjunction with FIG. 1 to be spaced away from the power transistor 10. Then the collector and base electrodes 10b and 10c of the transistor 10 are connected to suitable points on the thick film integrated circuit through respective electric leads 10g and 10e and a ground-lead 22 is connected at one end to a point of ground potential on the integrated circuit on the ceramic substrate 12 and at the other end to the metallic housing 18 through a solder 14. The metallic housing 18 serves as a grounding terminal for both the power transistor 10 and the thick film integrated circuit permitting the omission of the grounding terminal 16a shown in FIG. 1.

FIG. 2 shows the semiconductor chip 10a directly fixed to the housing 18 formed of aluminum. The aluminum housing is cheap but not so high in thermal conductivity. This requires time for dissipating heat from the power transistor 10.

Figure 3:
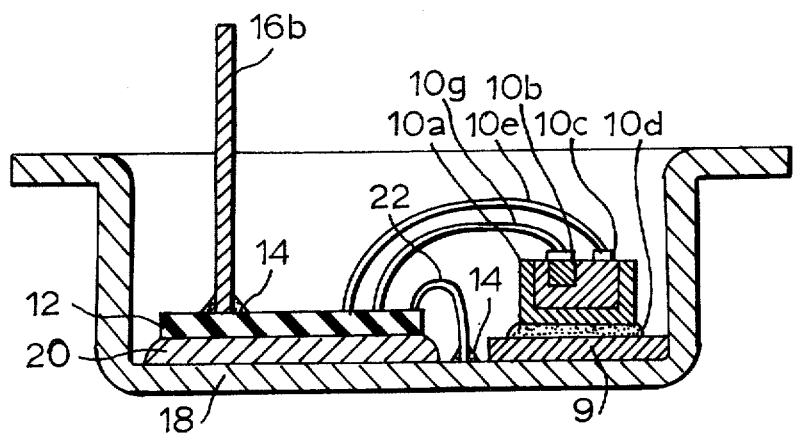
FIG. 3 is a view similar to FIG. 2 but illustrating a modification of the present invention.

The arrangement illustrated in FIG. 3 is effective for accelerating the dissipation of heat from the power transistor 10 itself. In the arrangement, the metallic housing 18 is formed of aluminum so as to have a large heat dissipation area and the power transistor is fixedly secured to the metallic housing 18 through a primary heat sink 9 made of a copper plate.

In other respects, the arrangement is identical to that shown in FIG. 2.

As the primary heat sink 9 is smaller in heat dissipation area than the aluminum housing 18 but the copper has a thermal conductivity higher than that of the aluminum, the heat sink 9 rapidly deprives the power transistor 10 of heat generated therein. The arrangement of FIG. 3 gives the result that at time interval within which heat is dissipated from the power transistor itself can be reduced.

The present invention has several advantages. For example, the heat dissipation effect is improved. This is because the semiconductor chip for the power transistor from which heat is principally generated can be attached directly or through the high thermally conducting member to the metallic housing serving also as the heat sink for the reasons that the power transistor is an emitter substrate type NPN transistor and heat generated in the transistor directly spreads in the metallic housing resulting in a decrease in corresponding thermal resistance. This permits semiconductor chips to decrease in size. Also the metallic housing acting also as the heat sink can decrease in size because the heat dissipation effect is enhanced. This results in a reduction in manufacturing cost. Further the layer of bonding agent is not included in the thermal path starting with the power transistor resulting in a minimum change in thermal resistance of the thermal path extending through the completed assembly. This leads to the advantage that the product is improved in reliability. In addition, the use of the emitter substrate type NPN transistor permits the metallic housing to be put at the emitter potential of the transistor or the ground potential thereby to cause the metallic housing to serve also as a grounding terminal. This eliminates the necessity of omitting a grounding terminal previously employed. Therefore the present invention is optimum for use with common emitter type power transistors.

While the present invention has been illustrated and described in conjunction with a few preferred embodiments thereof it is to be understood that numerous changes and modifications may be resorted to without departing from the spirit and scope of the present invention.

What is claimed is:

1. A hybrid thick film integrated circuit assembly comprising a metallic housing, an emitter substrate type power transistor element including an emitter electrode, and a thick film integrated circuit element connected to said power transistor element for controlling said power transistor element, said power transistor element and thick film integrated element being fixedly disposed in spaced relationship within said metallic housing, said power transistor element having said emitter electrode fixedly secured in direct physical contact to said metallic housing for being in direct electrical and thermal conducting relationship with said metallic housing, and said metallic housing having said integrated circuit element electrically connected thereto and said metallic housing being a grounding terminal for said assembly.

2. A hybrid thick film integrated circuit assembly as claimed in claim 1 wherein said power transistor element is an NPN type.

3. A hybrid thick film integrated circuit assembly as claimed in claim 1 wherein said power transistor is die bonded to the internal surface of said metallic housing.

4. A hybrid thick film integrated circuit assembly as claimed in claim 1 further comprising a plateshaped heat sink having said power transistor directly secured thereto and, said plate-shaped heat sink being directly secured to the internal surface of said metallic housing.

5. A hybrid thick film integrated circuit assembly as claimed in claim 4 wherein said metallic housing is made of aluminum and the heat sink is made of copper.

6. A hybrid thick film integrated circuit assembly as claimed in claim 1 further comprising plural electric leads and said power transistor having a collector electrode and a base electrode and said collector electrode and base electrode being connected to corresponding points on said thick film integrated circuit element by said electric leads respectively.

7. A hybrid thick film integrated circuit assembly as claimed in claim 1 further comprising a grounding electric lead for connecting said thick film integrated circuit element to said metallic housing through said grounding electric lead.

* * * * *